(12) United States Patent
Lin et al.

(10) Patent No.: US 8,803,337 B1
(45) Date of Patent: Aug. 12, 2014

(54) INTEGRATED CIRCUIT STRUCTURE HAVING DIES WITH CONNECTORS

(71) Applicant: Taiwan Semiconductor Manufacturing Company, Ltd., Hsin-Chu (TW)

(72) Inventors: Jing-Cheng Lin, Hsin-Chu (TW); Cheng-Lin Huang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/901,360

(22) Filed: May 23, 2013

Related U.S. Application Data

(60) Provisional application No. 61/783,630, filed on Mar. 14, 2013.

(51) Int. Cl.
*H01L 23/48* (2006.01)
*H01L 23/52* (2006.01)
*H01L 29/40* (2006.01)

(52) U.S. Cl.
USPC .................. 257/781; 257/780; 438/614

(58) Field of Classification Search
USPC .......... 257/780, 781, 686, 777, 778; 438/613, 438/614
See application file for complete search history.

(56) References Cited

U.S. PATENT DOCUMENTS

| 8,519,536 B2 * | 8/2013 | Jang et al. ............. 257/737 |
| 2007/0001317 A1 * | 1/2007 | Matsuoka et al. ........ 257/780 |
| 2012/0091577 A1 * | 4/2012 | Hwang et al. ........... 257/737 |
| 2014/0070409 A1 * | 3/2014 | Lai et al. .............. 257/737 |
| 2014/0077359 A1 * | 3/2014 | Tsai et al. ............. 257/737 |

* cited by examiner

*Primary Examiner* — S. V. Clark
(74) *Attorney, Agent, or Firm* — Slater and Matsil, L.L.P.

(57) ABSTRACT

An embodiment is an integrated circuit structure including a first die attached to a second die by a first connector. The first connector includes a solder joint portion between a first nickel-containing layer and a second nickel-containing layer, a first copper-containing layer between the first nickel-containing layer and the solder joint portion, and a second copper-containing layer between the second nickel-containing layer and the solder joint portion.

20 Claims, 3 Drawing Sheets

INTEGRATED CIRCUIT STRUCTURE HAVING DIES WITH CONNECTORS

This application claims priority to U.S. Provisional Application Ser. No. 61/783,630, filed on Mar. 14, 2013, entitled "Integrated Circuit Structure Having Dies with Connectors," which application is hereby incorporated herein by reference.

BACKGROUND

Since the development of the integrated circuit (IC), the semiconductor industry has experienced continued rapid growth due to continuous improvements in the integration density of various electronic components such as transistors, diodes, resistors, capacitors, and the like. For the most part, these improvements in integration density have come from repeated reductions in minimum feature size, which allows more components to be integrated into a given area. These integration improvements are essentially two-dimensional in nature, in that the area occupied by the integrated components is essentially on the surface of the semiconductor wafer. Various techniques have been developed to attempt to incorporate extra dimensionality into IC structures. One technique is referred to as a two and a half dimensional structure. These structures typically have interposers having a die stacked on the interposer. Interposers have been used to redistribute ball contact areas from that of the chip to a larger area of the interposer. Further, interposers have allowed for a package that includes multiple chips. Other techniques stack chips in a three dimensional (3D) structure. This allows for greater functionality with a reduced footprint of the structure.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosed subject matter, and do not limit the scope of the different embodiments.

Embodiments will be described with respect to integrated circuit structures, which can be two half dimensional integrated circuit (2.5DIC) structures, three dimensional integrated circuit (3DIC) structures or other structures.

Figure 1:
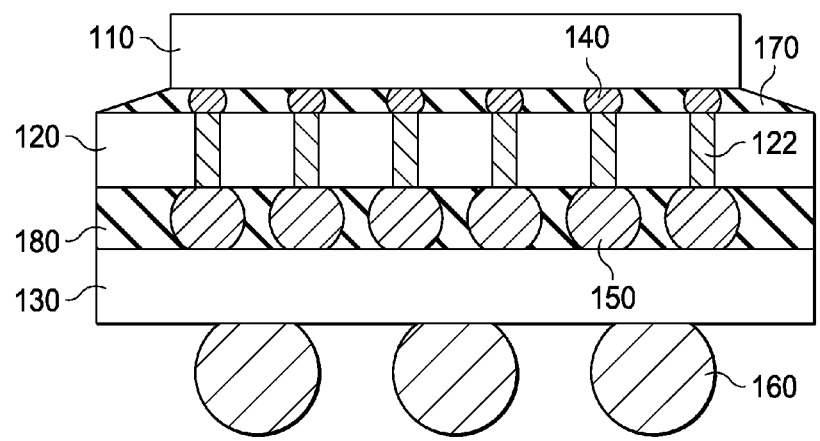
FIG. 1 is a cross-sectional diagram illustrating an integrated circuit structure according to an embodiment.

FIG. 1 illustrates an integrated circuit structure 100 according to an embodiment. The structure 100 comprises a first die 110 and a second die 120 attached to each other by a plurality of first connectors 140, and a workpiece 130 attached to the second die 120 through a plurality of second connectors 150. The workpiece 130 includes a plurality of third connectors 160 formed on one side opposite to the side attached to the second die 120, for connecting other substrates or devices.

In some embodiments, the first die 110 is a die having a low density of inputs and outputs, such as a dynamic random access memory (DRAM) die, a memory stack of dies, a radio frequency signal processing die, or the like. In other embodiments, the first die 110 is a die having a high density of inputs or outputs, such as a graphics processing unit (GPU) die, a logic device die, or the like. In some embodiments, the second die 120 is an active die, such as a DRAM die, a radio frequency signal processing die, a logic device die, a GPU die, or the like. In an embodiment, the second die 120 is an interposer free of active devices. In an embodiment, the second die 120 includes through substrate vias (TSVs), sometimes referred to as through silicon vias, 122 electrically connected to the first die 110 and/or the substrate 130. The sizes of the first die 110 and the second die 120 may be the same or different depending on varies in circuit designs and process flow controls. In embodiments, the workpiece 130 is a package substrate, an organic substrate, or a semiconductor substrate. In embodiments, a first underfill material 170 is between the first die 110 and the second die 120, and a second underfill material 180 is between the second die 14 and the substrate 130. It should be noted that the underfill materials 170 and 180 are optional in the integrated circuit structure 100.

In embodiments, bumps are formed on the first die 110 and the second die 120, and the jointed bumps form the first connectors 140 to provide electrical connection and physical support between the dies 110 and 120. In embodiments, the bumps between the dies 110 and 120 are micro bumps or controlled collapse chip connection (C4) bumps. One side of the workpiece 130 is attached to the second die 120 by the second connectors 150, such as C4 bumps, and the other side of the workpiece 130 has the third connectors 160, such as ball grid array (BGA) balls. In embodiments, a size and pitch of the third connectors 160 is larger than a size and a pitch of the second connectors 150, respectively. In embodiments, a size and pitch of the second connectors 150 is larger than a size and a pitch of the first connectors 140, respectively.

Figure 2:
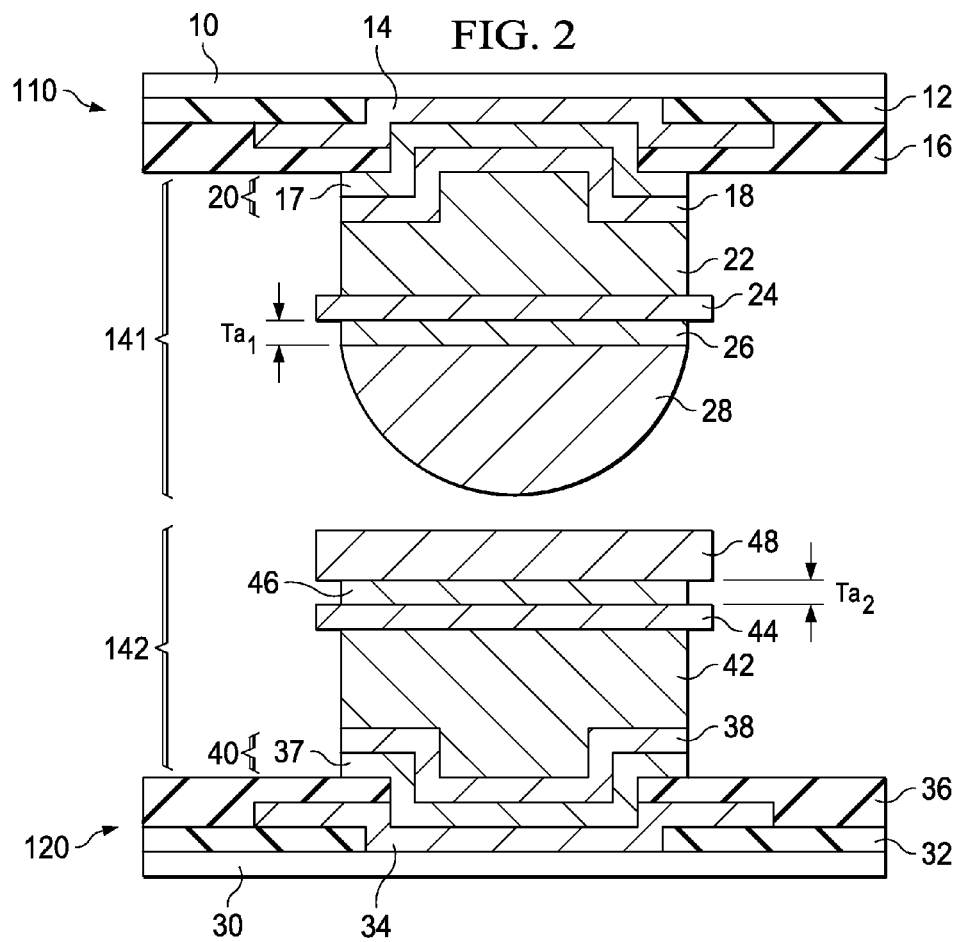
FIG. 2 is a cross-sectional diagram illustrating bumps on dies of an integrated circuit structure according to an embodiment.

FIG. 2 illustrates the formation of the bumps on the first die 110 and the second die 120 before attaching the first die 110 to the second die 120.

The first die 110 includes a first substrate 10, a first passivation layer 12 covering the first substrate 10, a first post-passivation interconnect (PPI) 14 formed through an opening in the first passivation layer 12, a first protective layer 16 covering the first passivation layer 12 and a portion of the PPI 14, and a first bump structure 141 over the first protective layer 16 electrically coupling the first PPI 14.

An example of the first substrate 10 may include a semiconductor substrate as employed in a semiconductor integrated circuit fabrication, and integrated circuits may be formed therein and/or thereupon. The semiconductor substrate is defined to mean any construction comprising semiconductor materials, including, but is not limited to, bulk silicon, a semiconductor wafer, a silicon-on-insulator (SOI) substrate, or a silicon germanium substrate. Other semiconductor materials including group III, group IV, and group V elements may also be used. The integrated circuits as used herein refer to electronic circuits having multiple individual circuit elements, such as transistors, diodes, resistors, capacitors, inductors, and other active and passive semiconductor devices. The substrate 10 further includes inter-layer dielectric layers and a metallization structure overlying the integrated circuits.

In embodiments, the first passivation layer 12 is formed of a non-organic material selected from un-doped silicate glass (USG), silicon nitride, silicon oxynitride, silicon oxide, and combinations thereof. In other embodiments, the first passivation layer 12 is formed of a polymer layer, such as an epoxy, polyimide, benzocyclobutene (BCB), polybenzoxazole (PBO), and the like, although other relatively soft, often organic, dielectric materials can also be used. The first passivation layer 12 may be a single layer or a multi-layered structure.

In embodiments, the first PPI 14 is a metallization structure electrically coupled a metallization layer within the first substrate 10. For example, the first PPI 14 is formed by initially forming a seed layer (not shown), such as a titanium (Ti) layer, a tatanium (Ta) layer, a tatanium nitride (TaN) layer, a copper (Cu) layer or a Cu alloy layer, and then plating a conductive material layer, such as an aluminum (Al) layer, a Cu layer, a AlCu layer, a gold (Au) layer, or combinations thereof. The pattern of the first PPI 14 can be defined by a suitable photolithographic mask and etching process.

The first protective layer 16 may be formed from a polymer such as polyimide, or may be formed of silicon oxide, silicon nitride, low-k dielectric, extremely low-k dielectric, the like, or a combination thereof. An opening is made through the first protective layer 16 by removing portions of the first protective layer 16 to expose at least a portion of the underlying first PPI 14. The opening is formed using, for example, a suitable photolithographic mask and etching process.

The first bump structure 141 is over the first protective layer 16 and electrically coupled the first PPI 14 through the opening formed in the first protective layer 16. In embodiments, the first bump structure 141 includes a first under-bump metallization (UBM) layer 20 in an opening through the first protective layer 16 electrically coupling the first PPI 14, a first metal pillar 22 on the first UBM layer 20, a first metal cap layer 24 on the first metal pillar 22, a first metal insertion layer 26 on the first metal cap layer 24, and a first solder layer 28 on the first metal insertion layer 26.

In embodiments, the first UBM layer 20 is formed in electrical contact with the first PPI 14. The first UBM layer 20 may be formed of titanium, titanium nitride, tatanium, tatanium nitride, tungsten, titanium tungsten, nickel, gold, chrome, copper, or copper alloy. Any suitable materials or layers of material that may be used for the UBM are fully intended to be included within the scope of the current application. In embodiments, the first UBM layer 20 includes a first metallization layer 17 and a second metallization layer 18. For example, the first metallization layer 17 is an adhesion (or a metal barrier) layer formed of titanium or titanium nitride, and the second metallization layer 18 is a seed layer formed of copper. The first UBM layer 20 may be created by forming a metallization layer over the first protective layer 16 and in the opening in the first protective layer 16 using, for example, plating, sputtering, evaporation, or PECVD process. Once the metallization layer has been formed, portions of the metallization layer may then be removed through a suitable photolithographic masking and etching process to remove the undesired material and to leave the first UBM layer 20 in a desired shape, such as a circular, octagonal, square, or rectangular shape, although any desired shape may alternatively be formed.

The first metal pillar 22 is a copper layer formed on the UBM layer 20 according to some embodiments. The copper layer is intended to include substantially a layer including at least one of pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, the thickness of the first metal pillar 22 is greater than about 5 µm. For example, the thickness of the first metal pillar 22 is about 8 µm to about 10 µm. In other embodiments, the thickness of the first metal pillar 22 is greater than about 10 µm or greater than about 20 µm, although the thickness may be greater or smaller.

The first metal cap layer 24 is formed on the top of the first metal pillar 22. The first metal cap layer 24 may include nickel, tin, tin-lead (SnPb), gold (Au), silver, palladium (Pd), indium (In), nickel-palladium-gold (NiPdAu), nickel-gold (NiAu) or other similar materials or alloy. In an embodiment, the first metal cap layer 24 is a nickel layer, an Au layer, or a NiAu layer by plating. In an exemplary embodiment, the thickness of the first metal cap layer 24 is about 1 µm to about 5 µm, although the thickness may be greater or smaller.

The first metal insertion layer 26 is formed on the top of the first metal cap layer 24. In an embodiment, the first metal insertion layer 26 is a copper layer. The copper layer is intended to include substantially a layer including at least one of pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. The formation methods may include sputtering, printing, electro plating, electroless plating, and commonly used chemical vapor deposition (CVD) methods. In an exemplary embodiment, a thickness $T_{a1}$ of the first metal insertion layer 26 is equal to or greater than about 1.5 µm, although the thickness may be greater or smaller. For example, the thickness $T_{a1}$ is in the range from about 1.5 µm to about 5 µm.

The first solder layer 28 is then formed on the top of the first metal insertion layer 26. In embodiments, the first solder layer 28 is made of Sn, SnAg, Sn—Pb, SnAgCu (with Cu weight percentage less than 0.3%), SnAgZn, SnZn, SnBi—In, Sn—In, Sn—Au, SnPb, SnCu, SnZnIn, or SnAgSb, etc. Once a solder layer of tin has been formed on the structure, a reflow may be performed in order to shape the solder material into the desired shape.

According to some embodiments, the second die 120 includes a second substrate 30, a second passivation layer 32 covering the second substrate 30, a second PPI 34 formed through an opening in the second passivation layer 32, a second protective layer 36 covering the second passivation layer 32 and a portion of the second PPI 34, and a second bump structure 142 over the second protective layer 36 electrically coupling the second PPI 34. In embodiments, the second bump structure 142 includes a second UBM layer 40 in an opening through the second protective layer 36 electrically coupling the second PPI 34, a second metal pillar 42 on the second UBM layer 40, a second metal cap layer 44 on the second metal pillar 42, a second metal insertion layer 46 on the second metal cap layer 44, and a second solder layer 48 on the second metal insertion layer 46. In embodiments, the second UBM layer 40 includes a first metallization layer 37 and a second metallization layer 38. In an exemplary embodiment, a thickness $T_{a2}$ of the first metal insertion layer 26 is equal to or greater than about 1.5 µm, although the thickness may be greater or smaller. For example, the thickness $T_{a2}$ is in the range from about 1.5 μm to about 5 μm. These components on the second die 120 can be formed the same or similarly as discussed with regard to corresponding components on the first die 110 with appropriate modifications for sizes and shapes.

Once the first bump structure 141 is formed on the first die 110 and the second bump structure 142 is formed on the second die 120, the first die 110 is attached to the second die 120, such as by bonding the first bump structure 141 and the second bump structure 142. The first solder layer 28 and the second solder layer 48 are reflowed and jointed to form a permanent connection between the first die 110 and the second die 120, thus forming the first connector 140 as illustrate in FIG. 1.

Figure 3:
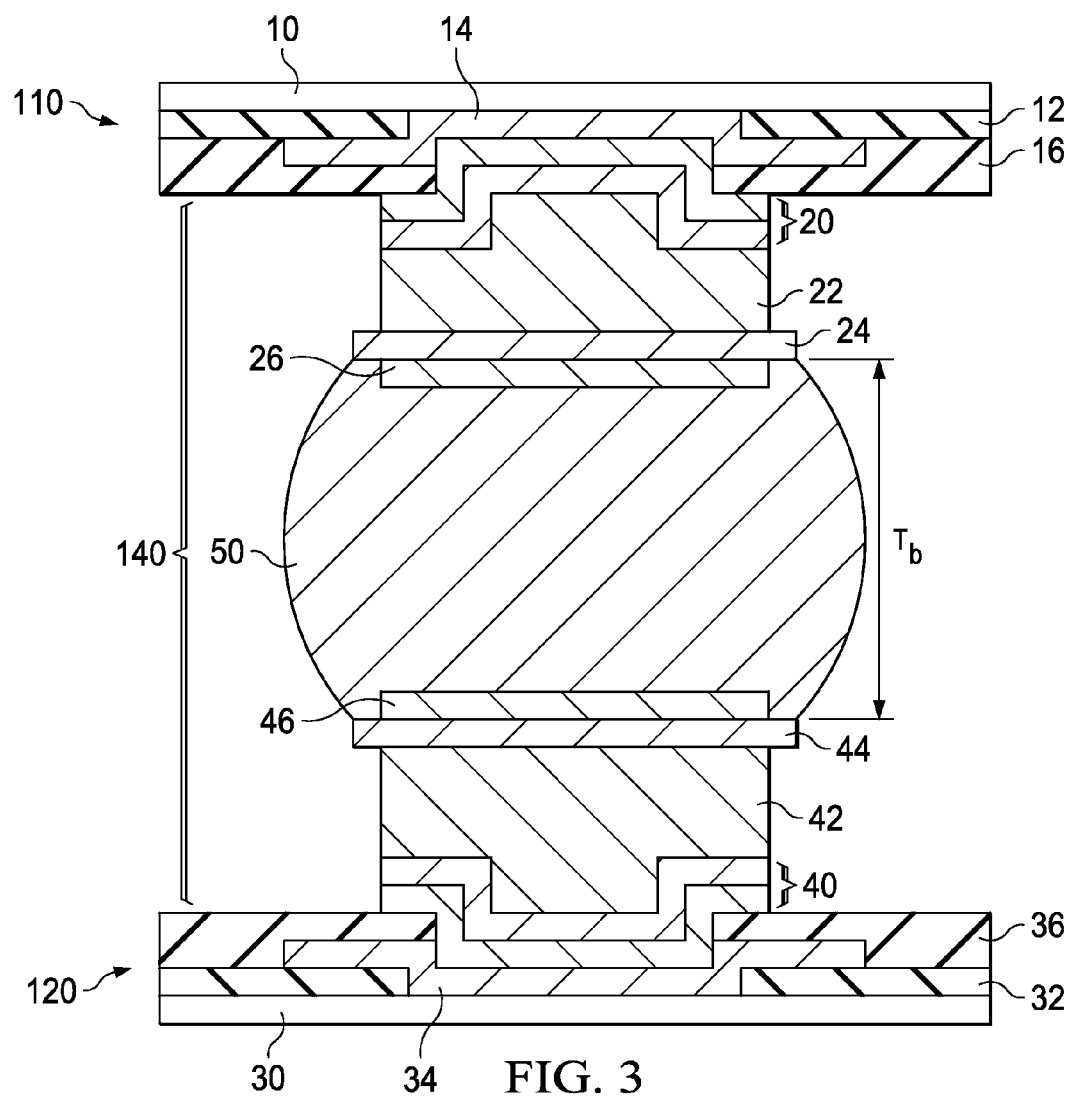
FIG. 3 is a cross-sectional diagram illustrating a connector between dies of an integrated circuit structure according to an embodiment.

FIG. 3 illustrates an example of the formation of the first connector 140 shown in FIG. 1. The structures of FIG. 2 are brought together and the solder layers 28 and 48 are reflowed to form a solder joint portion 50. A height of the first connector 140 between the first die 110 and the second die 120 can be between approximately 20 μm and approximately 30 micrometers. In an exemplary embodiment, a height $T_b$ between the metal insertion layers 26 and 26 is equal to or greater than about 10 μm, although the thickness may be greater or smaller. For example, the height $T_b$ is in the range from about 10 μm to about 20 μm.

Figure 4:
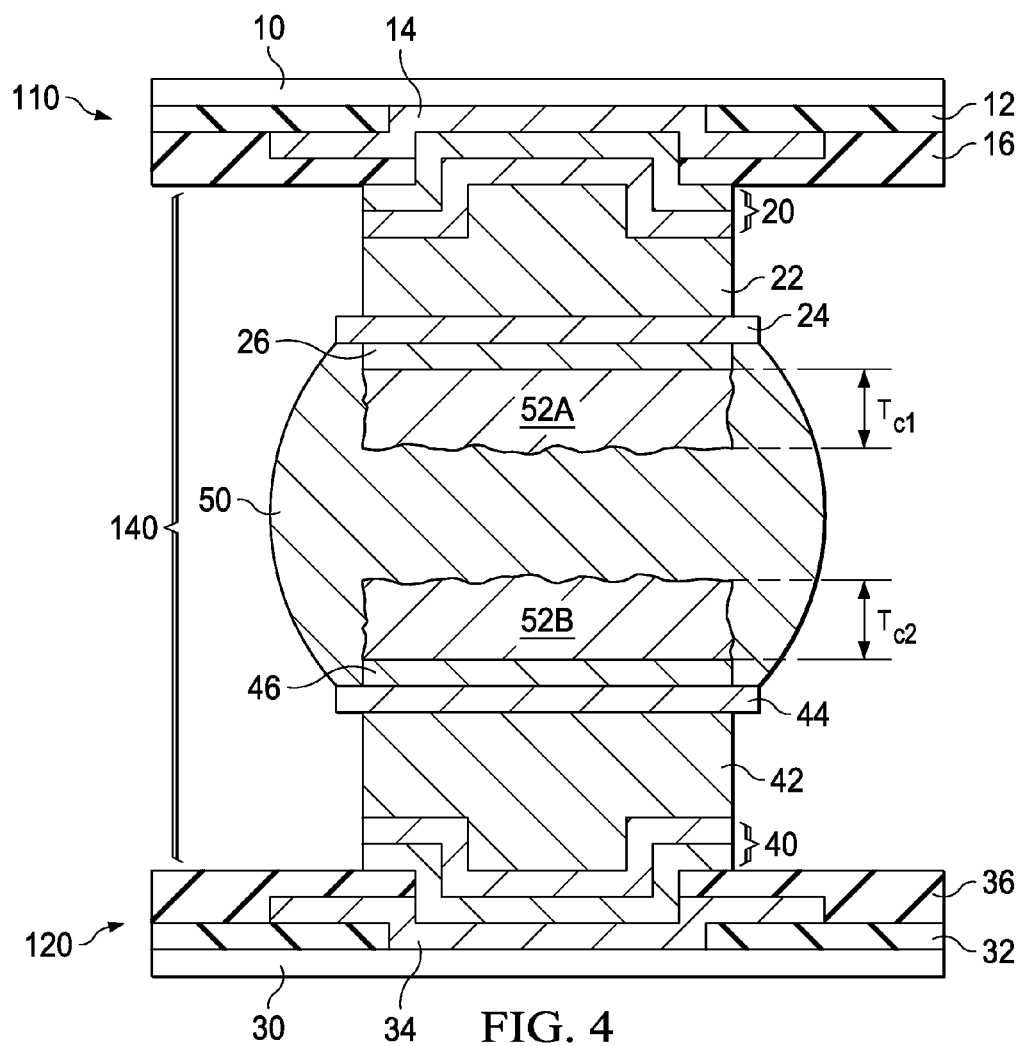
FIG. 4 is a cross-sectional diagram illustrating an intermetallic compound (IMC) layer in a connector of the integrated circuit structure according to an embodiment.

During thermal cycling, the tin in the solder joint portion 50 tends to migrate through cracks or other defects and react with the underlying layer (such as the metal insertion layers 26 and 46) to form an intermetallic compound (IMC) layer, and the metal insertion layers 26 and 46 may be consumed during the IMC formation. FIG. 4 illustrates an example of the formation of IMC layers in the first connector 140 shown in FIG. 3. In some embodiments, a first IMC layer 52A is formed at the interface between the first metal insertion layer 26 and the solder joint portion 50, and a second IMC layer 52B is formed at the interface between the second metal insertion layer 46 and the solder joint portion 50. In embodiments, the IMC layers 52A and 52B include $Cu_6Sn_5$ and/or $Cu_3Sn$. In embodiments, the IMC layers 52A and 52B are free of nickel. In an exemplary embodiment, a thickness $T_{c1}$ of the first IMC layer 52A is between about 3 μm and about 5 μm, a thickness $T_a$ of the second IMC layer 52B is between about 3 μm and about 5 μm, although the thickness may be greater or smaller. In the first connector 140, the metal insertion layer 26 and 46 can reduce solder source and interrupt the path of solder diffusion. It is experimentally observed that the IMC growth rate of $Cu_6Sn_5$ and $Cu_3Sn$ is three times faster than that of $Ni_3Sn_4$. Thereby, no solder wetting is observed on sidewalls of the metal pillar and void formation in the solder joint portion is minimized and/or eliminated. The device performance can be significantly improved by void reduction in the solder joint portion, and the improvements are observed in reliability testing, such as TCT (temperature cycling test) and HTS (high temperature storage) test.

An embodiment is an integrated circuit structure including a first die with a first bump structure, and a second die with a second bump structure. The first die is attached to the second die by bonding the first bump structure and the second bump structure. The first bump structure includes a first metal pillar comprising copper, a first metal cap layer comprising nickel on the first metal pillar, a first metal insertion layer comprising copper on the first metal cap layer, and a first solder layer on the first metal insertion layer.

Another embodiment is an integrated circuit structure including a first die attached to a second die by a first connector. The first connector includes a solder joint portion between a first nickel-containing layer and a second nickel-containing layer, a first copper-containing layer between the first nickel-containing layer and the solder joint portion, and a second copper-containing layer between the second nickel-containing layer and the solder joint portion.

A further embodiment is an integrated circuit structure including a first die attached to a second die through a first connector, and a workpiece attached to the second die through a second connector. The first connector includes a solder joint portion between a first copper pillar and a second copper pillar, a first nickel layer between the first copper pillar and the solder joint portion, a second nickel layer between the second copper pillar and the solder joint portion, a first intermetallic compound (IMC) layer comprising copper and tin between the first nickel layer and the solder joint portion, and a second IMC layer comprising copper and tin between the second nickel layer and the solder joint portion.

Although the present embodiments and their advantages have been described in detail, it should be understood that various changes, substitutions and alterations can be made herein without departing from the spirit and scope of the disclosure as defined by the appended claims. For example, although the foregoing embodiments were discussed with respect to structures comprising two dies, embodiments can have any number of dies with any combination of connectors attaching those dies.

Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. An integrated circuit structure comprising:
   a first die comprising a first bump structure; and
   a second die comprising a second bump structure,
   wherein the first die is attached to the second die by bonding the first bump structure and the second bump structure; and
   wherein the first bump structure comprises:
      a first metal pillar comprising copper;
      a first metal cap layer comprising nickel on the first metal pillar;
      a first metal insertion layer comprising copper on the first metal cap layer; and
      a first solder layer on the first metal insertion layer.

2. The integrated circuit structure of claim 1, wherein the second bump structure comprises:
   a second metal pillar comprising copper,
   a second metal cap layer comprising nickel on the first metal pillar;
   a second metal insertion layer comprising copper on the first metal cap layer; and
   a second solder layer on the first metal insertion layer.

3. The integrated circuit structure of claim 2, wherein the first solder layer and the second solder layer form a solder joint portion between the first metal insertion layer and a second metal insertion layer.

4. The integrated circuit structure of claim 3, further comprising a first intermetallic compound (IMC) layer at an interface between the solder joint portion and the first metal insertion layer.

5. The integrated circuit structure of claim 3, further comprising a second intermetallic compound (IMC) layer at an interface between the solder joint portion and the second metal insertion layer.

6. The integrated circuit structure of claim 1, wherein the first die is an active die, and the second die is an interposer free of active devices.

7. The integrated circuit structure of claim 1, wherein the second die comprises a through substrate via.

8. The integrated circuit structure of claim 1, further comprising a workpiece electrically coupling the second die through a plurality of connectors.

9. The integrated circuit structure of claim 1, wherein the first solder layer comprises a lead-free solder layer.

10. An integrated circuit structure comprising:
    a first die attached to a second die by a first connector, wherein the first connector comprises:
        a solder joint portion between a first nickel-containing layer and a second nickel-containing layer;
        a first copper-containing layer between the first nickel-containing layer and the solder joint portion; and
        a second copper-containing layer between the second nickel-containing layer and the solder joint portion.

11. The integrated circuit structure of claim 10, wherein the solder joint portion comprises a lead-free solder material.

12. The integrated circuit structure of claim 10, wherein the first connector comprises a first intermetallic compound (IMC) layer at an interface between the solder joint portion and the first copper-containing layer.

13. The integrated circuit structure of claim 10, wherein the first connector comprises a second intermetallic compound (IMC) layer at an interface between the solder joint portion and the second copper-containing layer.

14. The integrated circuit structure of claim 10, wherein first connector comprises a first copper-containing pillar on a first substrate of the first die, and wherein the first nickel-containing layer is between the first copper-containing pillar and the first copper-containing layer.

15. The integrated circuit structure of claim 10, wherein first connector comprises a second copper-containing pillar on a second substrate of the second die, and wherein the second nickel-containing layer is between the second copper-containing pillar and the second copper-containing layer.

16. The integrated circuit structure of claim 10, wherein the first die is an active die, and the second die is an interposer free of active devices.

17. The integrated circuit structure of claim 10, wherein the second die comprises a through substrate via.

18. A method of forming an integrated circuit structure comprising:
    forming on a first die a first bump structure by
        forming a first metal pillar comprising copper;
        forming a first metal cap layer comprising nickel on the first metal pillar;
        forming a first metal insertion layer comprising copper on the first metal cap layer; and
        forming a first solder layer on the first metal insertion layer
    forming on a second die a second bump structure by
        forming a second metal pillar comprising copper,
        forming a second metal cap layer comprising nickel on the first metal pillar;
        forming a second metal insertion layer comprising copper on the first metal cap layer; and
        forming a second solder layer on the first metal insertion layer; and
    bonding the first structure to the second bump structure.

19. The method of claim 18 further comprising reflowing at least one of the first solder layer and the second solder layer prior to the bonding step.

20. The method of claim 18 further comprising forming at least one of an intermetallic compound layer between the first solder layer and the first metal insertion layer, and an intermetallic compound layer between the second solder layer and the second metal insertion layer.

\* \* \* \* \*